(12) United States Patent
Liou et al.

(10) Patent No.: US 7,227,232 B2
(45) Date of Patent: Jun. 5, 2007

(54) CONTACTLESS MASK PROGRAMMABLE ROM

(75) Inventors: Jhyy-Cheng Liou, Jubei (TW); Chin-Hsi Lin, Hsinchu (TW)

(73) Assignee: Solid State System Co., Ltd., Hsinchu (TW)

( * ) Notice: Subject to any disclaimer, the term of this patent is extended or adjusted under 35 U.S.C. 154(b) by 198 days.

(21) Appl. No.: 10/509,908

(22) PCT Filed: Apr. 28, 2003

(86) PCT No.: PCT/IB03/01596

§ 371 (c)(1),
(2), (4) Date: Sep. 28, 2004

(87) PCT Pub. No.: WO2004/019372

PCT Pub. Date: Mar. 4, 2004

(65) Prior Publication Data

US 2005/0127454 A1    Jun. 16, 2005

(30) Foreign Application Priority Data

Aug. 26, 2002  (WO)  .................. PCT/IB02/03451

(51) Int. Cl.
*H01L 29/76* (2006.01)
*G11C 17/00* (2006.01)
(52) U.S. Cl. .................. 257/390; 257/392; 365/104
(58) Field of Classification Search ........ 257/390–392; 365/104
See application file for complete search history.

(56) References Cited

U.S. PATENT DOCUMENTS 4,350,992 A * 9/1982 Tubbs ................ 257/391
5,600,171 A * 2/1997 Makihara et al. ........... 257/390

* cited by examiner

*Primary Examiner*—Mark V. Prenty
(74) *Attorney, Agent, or Firm*—J.C. Patents

(57) ABSTRACT

A contactless Mask ROM is described, comprising a plurality of MOS-type memory cells. The memory cells include a plurality of first memory cells and a plurality of second memory cells. The first memory cells have a first channel conductivity so that they are depletion-mode MOS transistors, and the second memory cells have a second channel conductivity so that they are enhanced-mode MOS transistors. In the contactless Mask ROM, a memory cell shares two diffusions with two adjacent memory cells that are aligned with the memory cell along a first direction.

13 Claims, 7 Drawing Sheets

CONTACTLESS MASK PROGRAMMABLE ROM

BACKGROUND OF THE INVENTION

1. Field of Invention

The present invention relates to a semiconductor device. More particularly, the present invention relates to a contactless mask programmable read-only memory (Mask ROM).

2. Description of Related Art

Read-only memory (ROM) is a type of non-volatile memory, which can retain data as disconnected from power supply, and therefore is used to store permanent data like booting data of computer systems.

In order to simplify the fabricating processes and to increase the integration of ROM devices, various ROM structures are proposed based on shared diffusion and integration of the coding process and the contact process. Some conventional ROM devices are described below.

FIG. 1 illustrates a top view of a contact ROM in the prior art.

Referring to FIG. 1, the contact ROM 100 comprises rows and columns of MOS-type memory cells, wherein two adjacent memory cells in the same column constitute a cell pair 102 that is isolated by field isolation 104. The memory cells in the same row are controlled by a word line 106, and the memory cells in the same column are located under a bit line 108. The two memory cells in a cell pair 102 share a source 110 between the two drains 112 thereof, while the sources 110 of the cell pairs 102 in the same row are electrically connected to a ground line 114. In the contact ROM 100, a plurality of contacts 116 are selectively formed on the drains 112 of the memory cells as data codes, wherein the contacts in the same column are connected to a bit line 108.

During a reading operation of the contact ROM, the selected word line 106 is biased to high level. If the drain 112 of the selected memory cell has a contact 116 thereon electrically connecting with the selected bit line 108, a current can be conducted from the selected bit line 108 to the ground line 114 connecting with the source 110 of the selected memory cell. Otherwise, no current is detected. In other words, the data is stored as a contact pattern. However, since the field isolation 104 is formed between two rows of cell pairs 102 and contacts 116 are formed on the drains 112, the area of the memory array is large and the device integration is low.

FIG. 2 illustrates a top view of an implant programmable ROM in the prior art.

Referring to FIG. 2, the implant programmable ROM 200 comprises rows and columns of MOS-type memory cells 201. The memory cells in the same row are controlled by a word line 202 and every two rows of memory cells 201 are coupled to a ground line 204, while two columns of memory cells 201 are separated by isolation 203. A memory cell 201 shares a source 206 with one adjacent memory cell in the same column, and shares a drain 208 with the other adjacent memory cell in the same column. The sources 206 of the memory cells 201 in the same row are connected to a ground line 204, and the drains 208 of the memory cells 201 in the same column are electrically connected to a bit line 210 via contacts 212. The implant programmable ROM 200 is programmed by selectively implanting ions into the channel regions under the word lines 202 to make the selected channel regions 214 have a higher threshold voltage ($V_T$). During the reading operation of the implant programmable ROM, the selected word line 202 is biased to high level. If the channel region of the selected memory cell 201 is not implanted, the channel can be switched on and an On-current can be detected, otherwise the channel cannot be switched on and the channel current is extremely small.

As compared with the contact ROM 100 in FIG. 1, the implant programmable ROM 200 is more compact because the isolation between rows of memory cells is omitted and a drain 208 is shared by two memory cells 201 like a source 206. However, since an additional mask is needed for selectively implanting the channel regions of the memory cells 201, the fabricating process is more complex. Moreover, in consideration of the lateral area necessary for forming the contacts 212, the degree of area reduction of the drain region 208 is limited and the memory array cannot be further miniaturized.

FIG. 3 illustrates a top view of a Metal ROM in the prior art.

Referring to FIG. 3, the Metal ROM 300 has a NAND (NOT AND) structure and comprises rows and columns of MOS-type memory cells. The memory cells in the same row are controlled by a word line 302 and four continuous memory cells in the same column are grouped as a memory string 304. In a memory string 304, the diffusion 305 of one terminal memory cell is electrically connected to a ground line 306, and the diffusion 305 of the other terminal memory cell is coupled to a bank select transistor 308. The bank select transistor 308 is coupled to a bit line 320 parallel to the memory string 304 via a contact 322. The source and the drain of a memory cell, i.e., the two diffusions 305 of a memory cell, are both shared by adjacent cells.

The Metal ROM is programmed by selectively forming local interconnects 326 each connecting the two diffusions 305 of a selected memory cell. If a memory cell has a local interconnect 326 formed thereon like memory cell C1 does, the memory cell is always electrically conductible and acts like a depletion-type MOS devices, otherwise the memory cell is in the enhanced mode like memory cell C2 is. During a reading operation, the selected bit line 320 is coupled to a certain voltage level, the selected word line 302 is coupled to low level, and the unselected word lines 302 and the gate 340 of the bank select transistor 308 are coupled to high level. Thus, the bank select transistor 308 and all of the unselected memory cells in the same memory string 304 are switched on. Consequently, if the selected memory cell has a local interconnect 326 formed thereon, a current can be conducted through it and can be detected, otherwise no current is detected. The Metal ROM is more compact than the contact ROM, but the memory area in the Metal ROM cannot be further reduced because local interconnects must be formed on the diffusions 305 (sources and drains).

SUMMARY OF THE INVENTION

Accordingly, this invention provides a contactless mask programmable read-only memory (Mask ROM) that contains no contact in the memory area and has a smaller memory array for increasing device integration.

This invention also provides a NAND Mask ROM that is an implementation of the aforementioned contactless Mask ROM of this invention.

The contactless Mask ROM of this invention comprises a plurality of MOS memory cells, including a plurality of first memory cells and a plurality of second memory cells. The first memory cells have a first channel conductivity and are depletion MOS transistors, and the second memory cells have a second channel conductivity and are enhanced MOS transistors. In the contact Mask ROM, a memory cell shares two diffusions with two adjacent memory cells that are aligned with the memory cell along a first direction.

In the contactless Mask ROM of this invention, the memory cells may comprise NMOS or PMOS transistors. That is, the first memory cells may comprise depletion NMOS or PMOS transistors that have N-type or P-type channels, and the second memory cells may comprise enhanced NMOS or PMOS transistors that have P-type or N-type channels. Moreover, a string of memory cells that are arranged along a second direction different form the first direction is can be coupled to a word line. A diffusion of one terminal memory cell in a string of memory cells that are arranged along the first direction is coupled to a first voltage source of a first level, such as a bit line. A diffusion of the other terminal memory cell in the same string of memory cells is coupled to a second voltage source of a second level, such as a ground voltage source, wherein the second level is different from the first level.

The NAND Mask ROM of this invention is an implementation of the contactless Mask ROM mentioned above, comprising a plurality of word lines, a plurality of bit lines, and a plurality of memory cells arranged in rows and columns. The memory cells include a plurality of first memory cells that have a first channel conductivity and are depletion MOS transistors, and a plurality of second memory cells that have a second channel conductivity and are enhanced MOS transistors. The memory cells in the same row are coupled to one word line, and the memory cells in the same column are coupled to one bit line. A constant number of continuous memory cells in the same column are grouped as a memory string, wherein a non-terminal memory cell shares a source and a drain with two adjacent memory cells in the same memory string. In addition, one terminal memory cell in a memory string is coupled to a bit line, and the other terminal memory cell in the same memory string is coupled to ground.

As mentioned above, in the contactless Mask ROM of this invention, the data value stored in a memory cell corresponds to the conductivity type of the channel thereof, and no contact is formed on the diffusion regions in the memory area. Therefore, the Mask ROM of this invention is more compact than those in the prior art.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DESCRIPTION OF THE PREFERRED EMBODIMENTS

Figure 1:
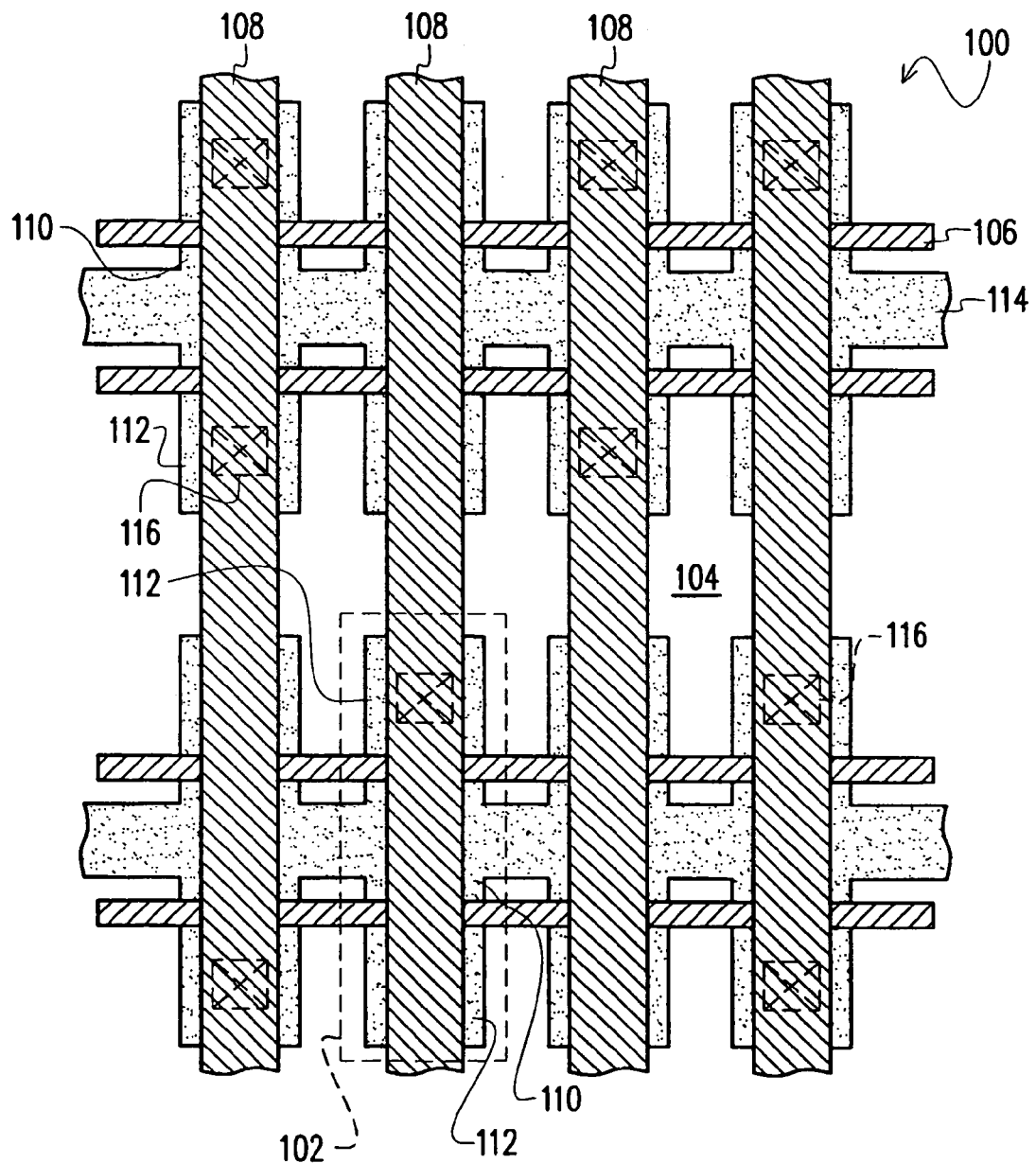
FIG. 1 illustrates a top view of a contact ROM in the prior art.
Figure 2:
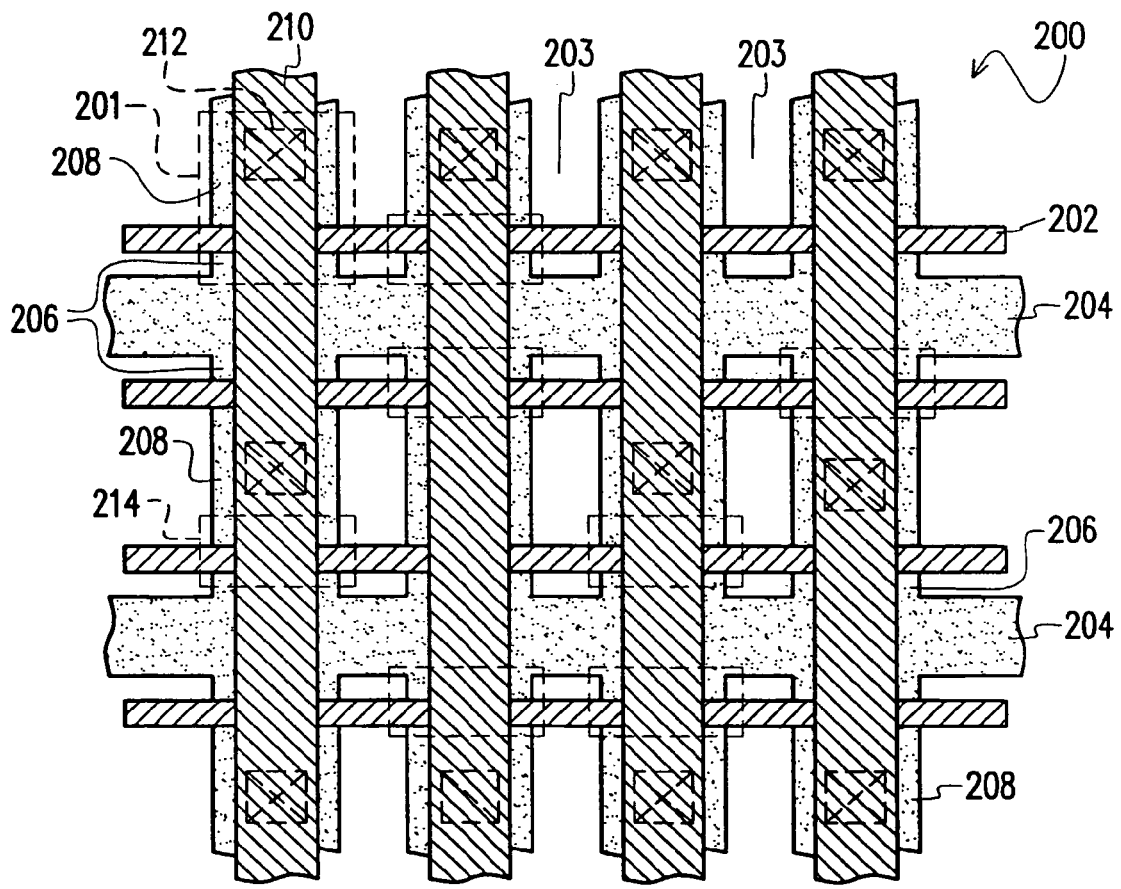
FIG. 2 illustrates a top view of an implant programmable ROM in the prior art.
Figure 3:
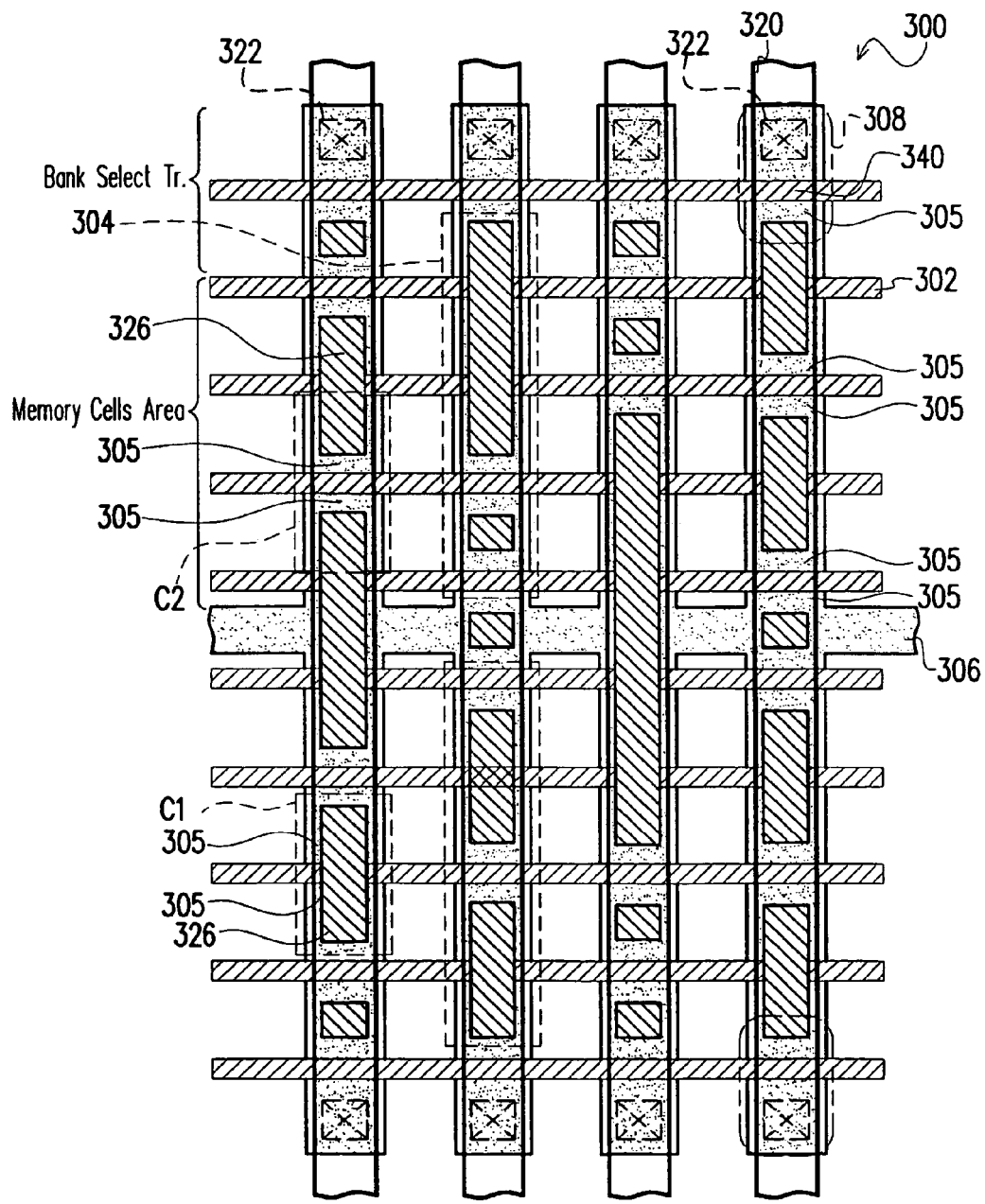
FIG. 3 illustrates a top view of a Metal ROM in the prior art.
Figure 4A:
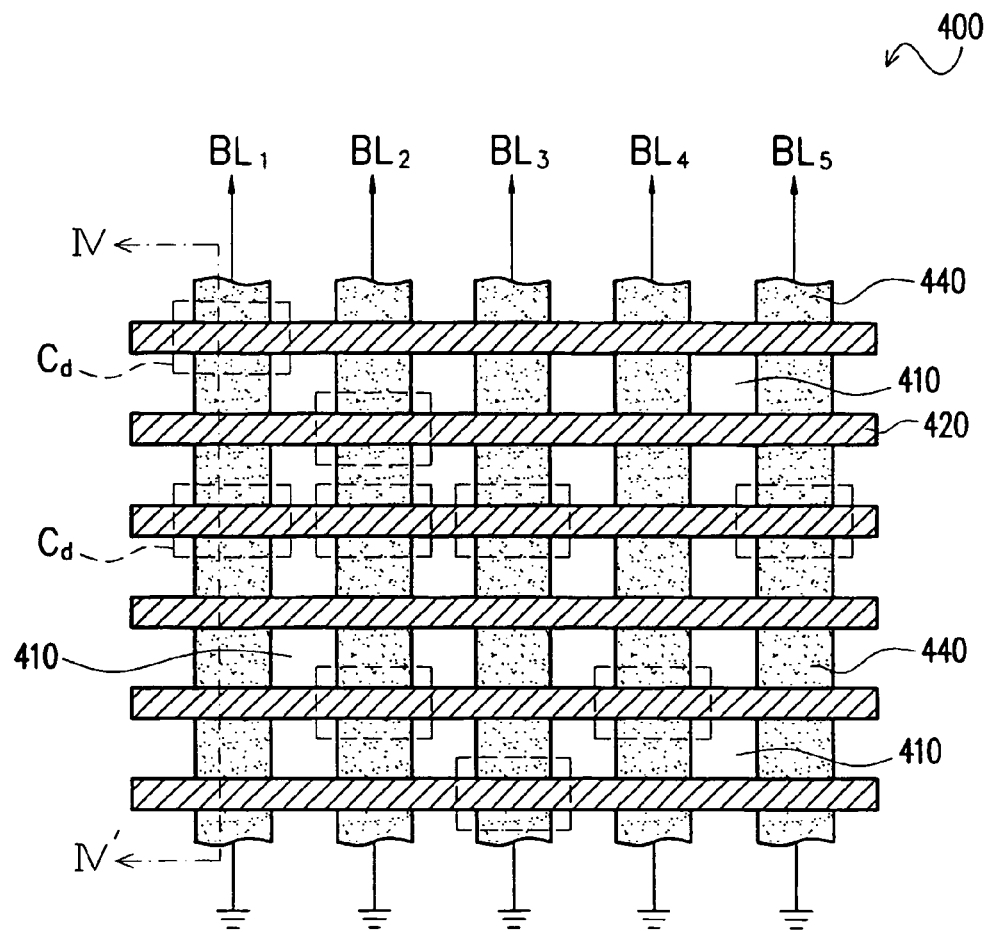
FIG. 4A illustrates a top view of a contactless Mask ROM according to an embodiment of this invention.
Figure 4B:
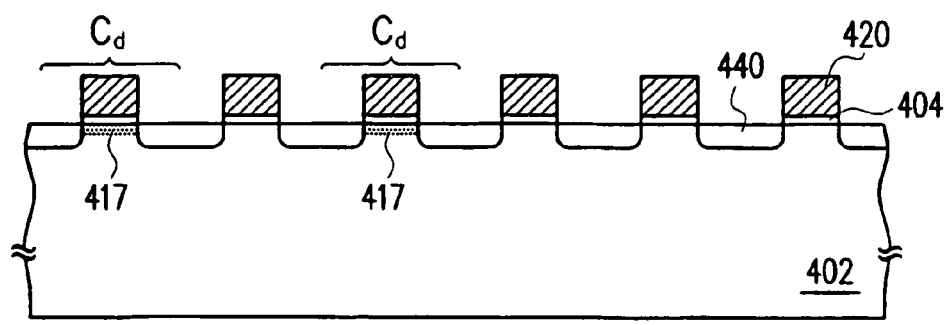
FIG. 4B illustrates a cross-sectional view of the same along line IV–IV'.

FIG. 4A illustrates a top view of a contactless Mask ROM according to an embodiment of this invention, and FIG. 4B illustrates a cross-sectional view of the same along line IV–IV'.

Referring to FIGS. 4A–4B, the contactless Mask ROM 400 comprises a plurality of word lines 420 extending in row direction, and rows and columns of N-type diffusions 440 located in a P-type substrate 402 (FIG. 4B). As shown in FIG. 4B, each word line 420 is isolated from the substrate 402 by gate dielectrics 404. The word lines 420 comprise a material such as doped polysilicon, and the N-type diffusions 440 are doped with phosphorous (P) or arsenic (As), for example. In the contactless Mask ROM 400, two columns of N-type diffusions 440 are separated by an isolation layer 410. Two rows of diffusions 440 are separated by a word line 420, and the two terminal diffusions 440 in each column of diffusions 440 are coupled to a bit line ($BL_n$) and ground, respectively. In addition, two adjacent diffusions 440 in the same column, the word line 420 and the gate dielectrics 404 between the two adjacent diffusions 440, and the substrate 402 between the two adjacent diffusions 440 together constitute a NMOS memory cell.

Referring to FIGS. 4A and 4B again, the channels of the memory cells $C_d$ that are marked with dash-line have been implanted with N-type dopants 417, such as phosphorous (P) or arsenic (As), and thereby have N-type conductivity. That is, the memory cells $C_d$ are converted to depletion NMOS transistors. The other memory cells are not implanted with n-type dopants in their channels, and remain as enhanced NMOS transistors. Since a depletion NMOS transistor has a negative threshold voltage and an enhanced one has a positive threshold voltage, the type of each memory cell, i.e., the data value stored in each memory cell, can be easily identified.

<Implementation of the Contactless Mask ROM>

Figure 5A:
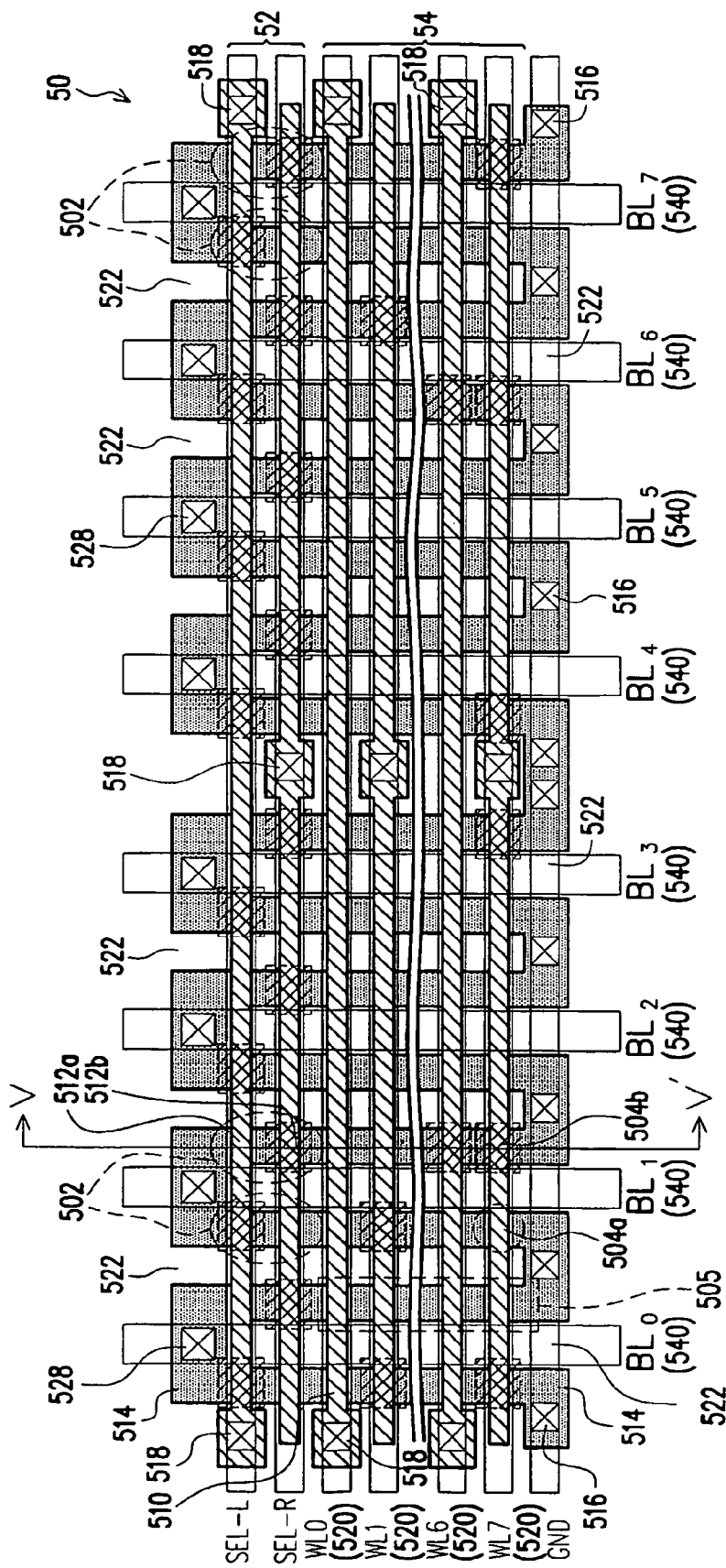
FIG. 5A illustrates a layout of a NAND Mask ROM according to a preferred embodiment of this invention.
Figure 5B:
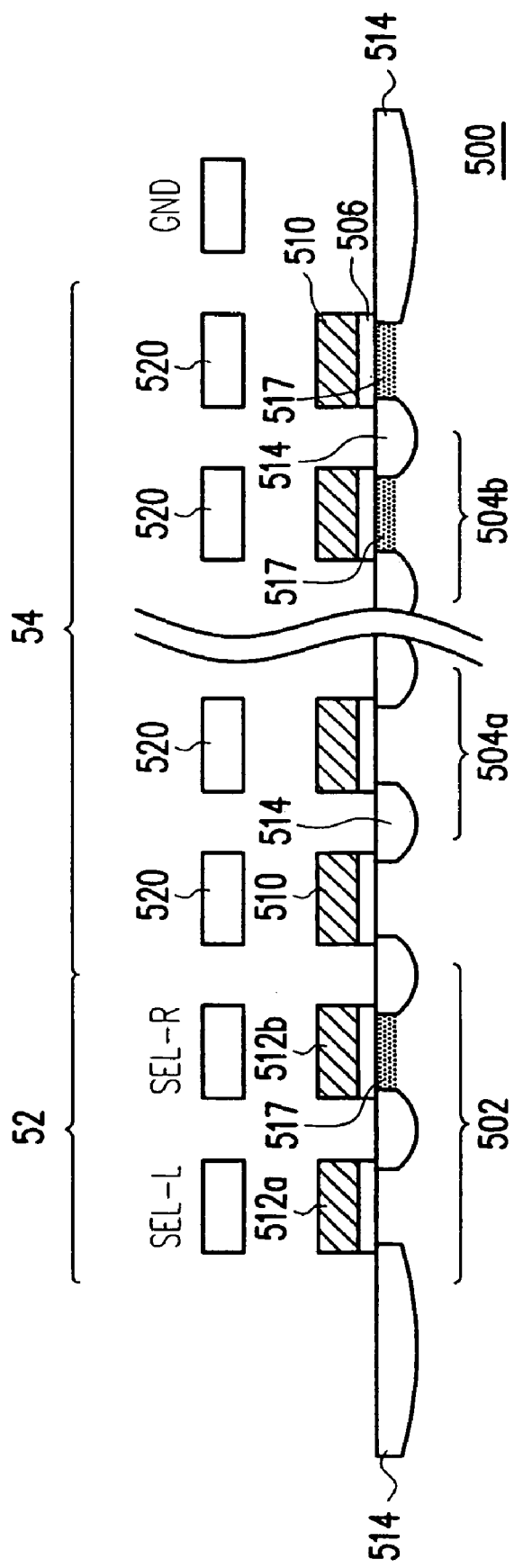
FIG. 5B illustrates a cross-sectional view of the same along line V–V'.
Figure 5C:
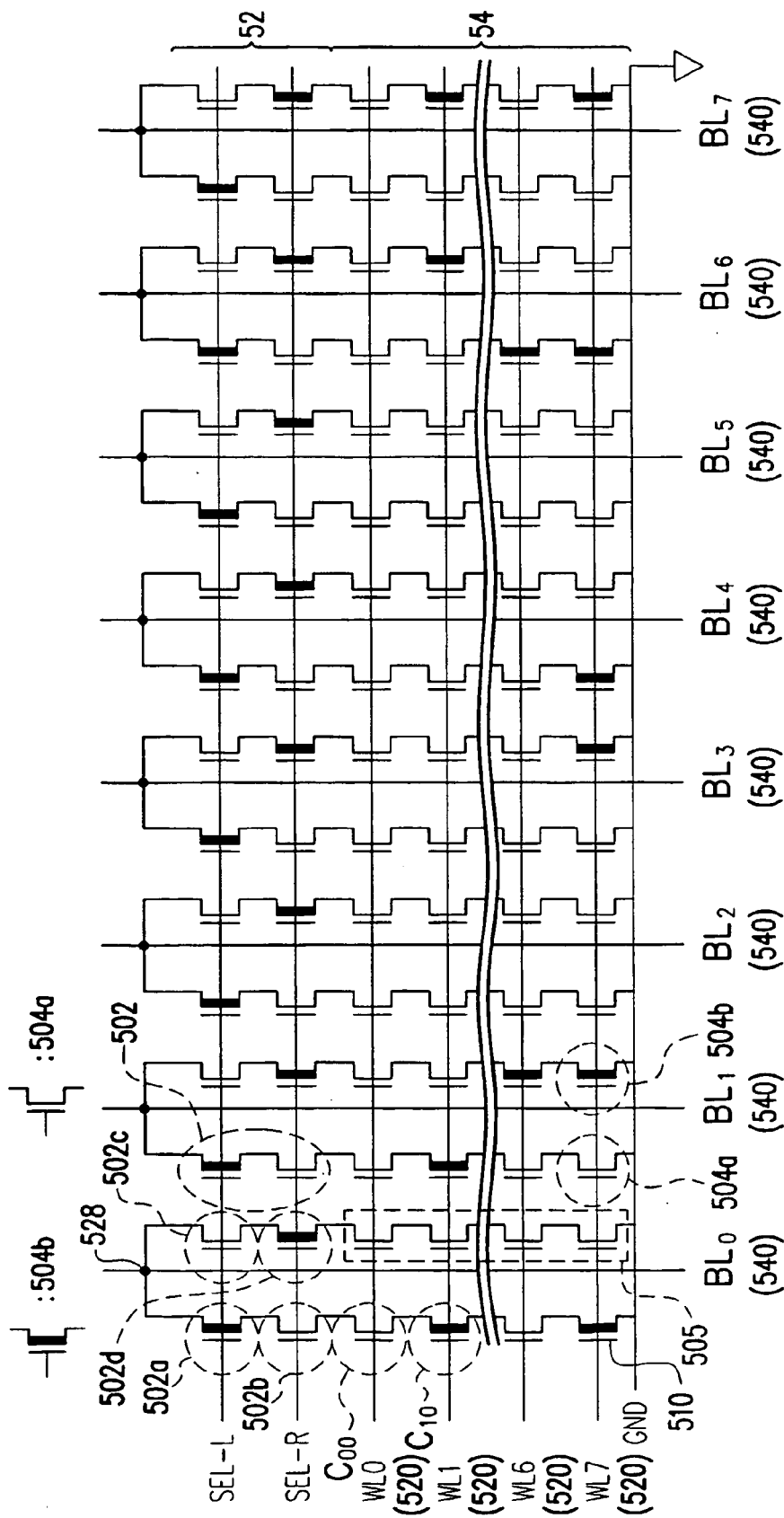
FIG. 5C illustrates the equivalent circuit of the same.

FIGS. 5A–5C illustrate a NAND Mask ROM according to the preferred embodiment of this invention, the NAND Mask ROM being an implementation of the aforementioned contactless Mask ROM. FIG. 5A illustrates the layout of the NAND Mask ROM, FIG. 5B illustrates a cross-sectional view of the same along line V–V', and FIG. 5C illustrates the equivalent circuit of the same.

Referring to FIGS. 5A–5B, the NAND Mask ROM 50 includes a bank select area 52 where bank select transistors 502 of NMOS type are formed, and a memory cell area 54 where NMOS memory cells 504a/b are formed. In the memory cell area 54, the memory cells 504a/b in the same row are coupled to a word line 520, and eight memory cells 504a/b in the same column are grouped as a memory string 505 accompanied with two bank select transistors 502. In addition, two adjacent memory strings 505 share a bit line 540, and the terminal memory cells 504a/b not adjacent to the bank select area 52 is coupled to a ground line GND.

Referring to FIGS. 5A–5B again, each memory cell 504a/b is constituted by gate dielectrics 506, a gate electrode 510, two diffusions 514, and a channel region under the gate dielectrics 506 and between the two diffusions 514. The NMOS memory cells 504b have been implanted with N-type dopants 517 in the channels thereof, and are thereby converted to depletion NMOS transistors, while NMOS memory cells 504a are not implanted with N-type dopants and remain as enhanced NMOS transistors. In each memory string, a non-terminal memory cell 504a/b shares two diffusions 514 thereof with two adjacent memory cells 504a/b. One terminal memory cell 504a/b share a diffusion 514 with a bank select transistor 502, and a diffusion of the other terminal memory cell 504a/b is connected to the ground line GND via a contact 516. The gate electrodes 510 of the memory cells 504a/b in the same row are formed as a gate line, which is electrically connected to a word line 520 via contacts 518. In addition, two adjacent columns of memory cells 504a/b are separated by an isolation layer 522.

Referring to FIGS. 5A–5B again, the bank select transistors 502 are arranged in rows and columns, wherein the four bank select transistors 502 for selecting a pair of memory strings 505 that share the same bit line are arranged in two rows and two columns. The gate electrodes 512a/b of the bank select transistors 502 in the same row are formed as a gate line, which is coupled to a bank select line SEL-L(eft) or -R(ight) via contacts 518. The two bank select transistors 502 for selecting a memory string 505 share a diffusion 514, and the two terminal bank select transistors 502 accompanied with a pair of memory strings 501 share a common diffusion 514 that is coupled to a bit line via a contact 528. Thereby, the pair of memory strings 501 are coupled to the same bit line. In addition, one of the pair of bank select transistors 502 for selecting a memory string 505 has been implanted with N-type dopants 517 and converted to a depletion NMOS transistor, while the other remains as an enhanced NMOS transistor. Moreover, among the pair of bank select transistors 502 for selecting a memory string 505, the depletion one is coupled to a bank select line (SEL-L or R) together with the enhanced bank select transistor 502 in the adjacent memory string 505 that shares the same bit line. Meanwhile, the enhanced one is coupled to another bank select line (SEL-R or L) together with the depletion bank select transistor 502 in the adjacent memory string 505. With such a design, each of the two memory strings 505 that share the same bit line can be specifically selected in a reading operation. The selection mechanism is described in detail below.

Reading Operation of the NAND Mask ROM

Refer to FIG. 5C, when the memory cell $C_{10}$ coupled to word line WL1 and bit line BL0 is being read, for example, the bank select line SEL-L is coupled to low level, such as 0V, the bank select line SEL-R is coupled to high level, and BL0 is coupled to an operating voltage $V_{CC}$, such as 1V. Since the bank select transistor 502a is a depletion NMOS transistor that is always in On-state, and the gate of the enhanced bank select transistor 502b is coupled to high level to form a channel under it, the corresponding (left) memory string 505 can be selected. On the contrary, the bank select transistor 502c of the adjacent memory string that shares the same bit line BL0 is an enhanced NMOS transistor, and is not switched on with the low level applied to the bank select line SEL-L. Therefore, the adjacent (right) memory string 505 is not selected. That is, as the left memory string 505 is to be selected, the bank select line SEL-L is coupled to low level, and the other bank select line SEL-R is coupled to high level. On the contrary, as the right memory string 505 is to be selected, the bank select line SEL-R is coupled to low level, and the other bank select line SEL-L is coupled to high level.

Meanwhile, in the memory area 54, the selected word line WL1 is coupled to low level, such as 0V, and the unselected world lines WL0 and WL2–7 are coupled to high level for switching on the enhanced NMOS memory cells 504a among the unselected memory cells, while the depletion NMOS memory cells 504b are already in On-state. Since the memory cell $C_{10}$ is a depletion NMOS transistor, it is already in On-state. Therefore, a current can flow from the bit line BL0 to the ground via the two bank select transistors 502a and 502b and all of the memory cells 504a/b in the selected memory string 505, and can be detected.

Analogously, when the memory cell $C_{00}$ coupled to word line WL0 and bit line BL0 is being read, WL0 is coupled to low level, and the unselected world lines WL1–7 are coupled to high level to switch on the enhanced NMOS memory cells 504a among the unselected memory cells, while the depletion NMOS memory cells 504b are already in On-state. Since the memory cell $C_{00}$ is an enhanced NMOS transistor, it is not switched on with the low level applied to WL0. Consequently, the current from BL0 to ground is extremely small even though the unselected memory cells 504a/b in the same memory string 505 are all in On-state.

Accordingly, with special design of bank select transistors and the method mention above, each memory cell 504a or 504b in the NAND Mask ROM can be specifically selected, and the mode (depletion or enhanced) of the selected memory cell, i.e., the data value of the selected memory value, can be easily identified. However, the configuration of the bank select area is not restricted to that mentioned above, and can be any one known in the prior art. For example, one memory string may be accompanied with only one bank select transistor that is coupled to a bit line, and does not share the bit line with another memory string adjacent in the row direction.

As mentioned above, in the contactless Mask ROM or NAND Mask ROM of this invention, the value of the data stored in a memory cell corresponds to the conductivity type of the channel thereof, and no contact is formed on the diffusion regions in the memory area. Therefore, the Mask ROM of this invention is more compact than those in the prior art.

It will be apparent to those skilled in the art that various modifications and variations can be made to the structure of the present invention without departing from the scope or spirit of the invention. In view of the foregoing, it is intended that the present invention covers modifications and variations of this invention provided they fall within the scope of the following claims and their equivalents.

What is claimed is:

1. A NAND Mask ROM, comprising a plurality of word lines, a plurality of bit lines, and a plurality of memory cells arranged in rows and columns, wherein the memory cells include a plurality of first memory cells that have a first channel conductivity and are depletion MOS transistors, and a plurality of second memory cells that have a second channel conductivity and are enhanced MOS transistors;

the memory cells in the same row are coupled to a word line, and the memory cells in the same column are coupled to a bit line;

a constant number of continuous memory cells in the same column are grouped as a memory string, wherein
 a non-terminal memory cell shares a source and a drain with two adjacent memory cells in the memory string; and
 one terminal memory cell in the memory string is coupled to a bit line, and the other terminal memory cell is coupled to ground, wherein gate electrodes of the memory cells in the same row are coupled to a word line with contacts.

2. The NAND Mask ROM of claim 1, wherein the memory cells comprise NMOS transistors, the first memory cells comprise depletion NMOS transistors that have N-type channels, and the second memory cells comprise enhanced NMOS transistors that have P-type channels.

3. The NAND Mask ROM of claim 1, wherein the memory cells comprise PMOS transistors, the first memory cells comprise depletion PMOS transistors that have P-type channels, and the second memory cells comprise enhanced PMOS transistors that have N-type channels.

4. A NAND Mask ROM, comprising a plurality of word lines, a plurality of bit lines, and a plurality of memory cells arranged in rows and columns, wherein
   the memory cells include a plurality of first memory cells that have a first channel conductivity and are depletion MOS transistors, and a plurality of second memory cells that have a second channel conductivity and are enhanced MOS transistors;
   the memory cells in the same row are coupled to a word line, and the memory cells in the same column are coupled to a bit line;
   a constant number of continuous memory cells in the same column are grouped as a memory string, wherein a non-terminal memory cell shares a source and a drain with two adjacent memory cells in the memory string; and
   one terminal memory cell in the memory string is coupled to a bit line, and the other terminal memory cell is coupled to ground,
   wherein two memory strings adjacent in the row direction share one bit line, the two adjacent memory strings consisting of a first memory string and a second memory string.

5. The NAND Mask ROM of claim 4, wherein
   each memory string is selected with a pair of bank select transistors, including a depletion MOS transistor and an enhanced MOS transistor that are coupled, wherein one of the two bank select transistors is coupled to a terminal memory cell in the memory string;
   the two pairs of bank select transistors are arranged in two rows and two columns, wherein two bank select transistors in the same row are coupled to a bank select line with gate electrodes thereof, and two terminal bank select transistors accompanied with the two adjacent memory strings are coupled to the bit line; and
   the depletion (or enhanced) MOS transistor among the pair of bank select transistors for selecting the first memory string is coupled to a bank select line together with the enhanced (or depletion) MOS transistor among the pair of bank select transistors for selecting the second memory string.

6. The NAND Mask ROM of claim 5, wherein one of the two bank select transistors for selecting a memory string shares a diffusion with a terminal memory cell in the memory string.

7. The NAND Mask ROM of claim 5, wherein the depletion MOS transistor and the enhanced MOS transistor in a pair of bank select transistors for selecting a memory string share a diffusion.

8. The NAND Mask ROM of claim 5, wherein the two terminal bank select transistors accompanied with the two adjacent memory strings share a diffusion that is coupled to the bit line.

9. The NAND Mask ROM of claim 1, wherein a memory string is coupled to a bit line, and does not share the bit line with another memory string adjacent in the row direction.

10. The NAND Mask ROM of claim 9, wherein one terminal memory cell in a memory string is coupled to a bit line via one bank select transistor.

11. The NAND Mask ROM of claim 1, wherein a diffusion of the other terminal memory cell in the memory string is coupled to a ground line via a contact.

12. The NAND Mask ROM of claim 1, wherein two memory strings are separated by an isolation layer.

13. The NAND Mask ROM of claim 1, wherein the constant number is 8.

* * * * *